United States Patent
Won et al.

(10) Patent No.: US 8,492,786 B2
(45) Date of Patent: Jul. 23, 2013

(54) LIGHT EMITTING DEVICE PACKAGE AND LIGHTING SYSTEM

(75) Inventors: Sunghee Won, Seoul (KR); Youngsu Chun, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/412,024

(22) Filed: Mar. 5, 2012

(65) Prior Publication Data

US 2012/0305962 A1  Dec. 6, 2012

(30) Foreign Application Priority Data

May 30, 2011 (KR) .................. 10-2011-0051340

(51) Int. Cl.
*H01L 33/00* (2010.01)
*H01L 21/82* (2006.01)
(52) U.S. Cl.
USPC ............ 257/98; 257/432; 257/693; 257/784; 257/E23.024; 257/E33.066; 257/E23.031; 257/E23.066; 257/E23.042; 438/123

(58) Field of Classification Search
None
See application file for complete search history.

(56) References Cited

U.S. PATENT DOCUMENTS

| | | | |
|---|---|---|---|
| 2002/0171155 A1* | 11/2002 | Fujihira | 257/780 |
| 2003/0162378 A1* | 8/2003 | Mikami | 438/612 |
| 2003/0207510 A1* | 11/2003 | Tomimatsu | 438/200 |
| 2009/0014850 A1* | 1/2009 | Craig et al. | 257/673 |
| 2011/0108866 A1* | 5/2011 | Lee et al. | 257/98 |

* cited by examiner

*Primary Examiner* — Alonzo Chambliss
(74) *Attorney, Agent, or Firm* — KED & Associates LLP

(57) ABSTRACT

A light emitting device package is disclosed. The light emitting device package includes a light emitting device disposed on a first lead frame, the light emitting device having an electrode pad on an upper surface thereof, a first wire to electrically interconnect a second lead frame spaced apart from the first lead frame and the electrode pad, and a first bonding ball disposed on the second lead frame, the first bonding ball spaced apart from a first contact point, which is in contact with the first wire and the second lead frame, wherein the first bonding ball is disposed between the first wire and the second lead frame to electrically interconnect the first wire and the second lead frame.

20 Claims, 7 Drawing Sheets

LIGHT EMITTING DEVICE PACKAGE AND LIGHTING SYSTEM

CROSS-REFERENCE TO RELATED APPLICATION

This application claims the priority benefit of Korean Patent Application No. 10-2011-0051340, filed on May 30, 2011 in the Korean Intellectual Property Office, the disclosure of which is incorporated herein by reference.

BACKGROUND

1. Field

Embodiments relate to a light emitting device package, and more particularly to a light emitting device wherein wire bonding is performed using a bonding ball, thereby improving reliability of wire bonding.

2. Description of the Related Art

A light emitting diode (LED) is a semiconductor device that converts an electrical signal into light using the properties of a compound semiconductor. The LED is used in electric home appliances, remote controllers, electric bulletin boards, displays, various kinds of automated equipment, etc. The application range of LEDs continues to expand.

Generally, a miniaturized LED is formed of a surface mount device type so that the LED is directly mounted on a printed circuit board (PCB). As a result, an LED lamp, using as a display device, has been developed to have a surface mount device type structure. The surface mount device may replace an existing simple lighting lamp. The surface mount device may be used as various colored lighting displays, text displays, image displays, etc.

To drive the LED, it is necessary to electrically connect the LED to a lead frame using wire bonding. A wire bonded portion (a secondarily bonded portion) of the lead frame is weaker than a wired bonded portion (a primarily bonded portion) of the LED. During wire bonding, therefore, the wired bonded portion (the secondarily bonded portion) of the lead frame may be broken by external impact. Consequently, it is necessary to improve reliability of wire bonding.

BRIEF DESCRIPTION OF THE DRAWINGS

Details of embodiments will be more clearly understood from the following detailed description taken in conjunction with the accompanying drawings, in which.

DETAILED DESCRIPTION OF EMBODIMENTS

Figure 1:
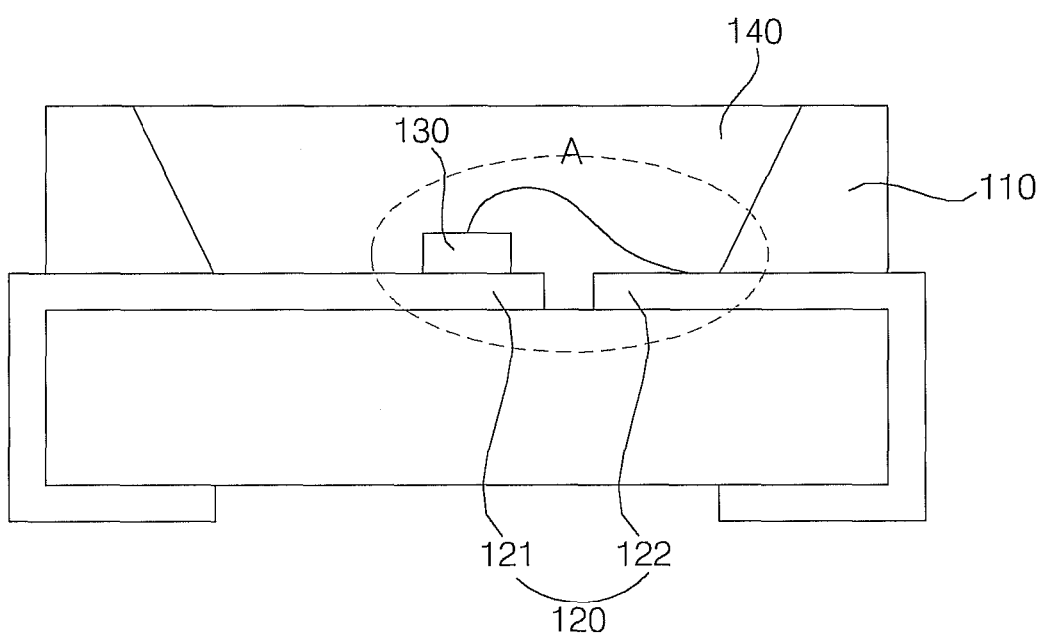
FIG. 1 is a sectional view showing a light emitting device package according to an embodiment.

Reference will now be made in detail to embodiments, examples of which are illustrated in the accompanying drawings. However, the present disclosure may be embodied in many different forms and should not be construed as limited to the embodiments set forth herein. Rather, these embodiments are provided so that this disclosure will be thorough and complete, and will fully convey the scope of the disclosure to those skilled in the art. The present disclosure is defined only by the categories of the claims. In certain embodiments, detailed descriptions of device constructions or processes well known in the art may be omitted to avoid obscuring appreciation of the disclosure by a person of ordinary skill in the art. Wherever possible, the same reference numbers will be used throughout the drawings to refer to the same or like parts.

Spatially-relative terms such as "below", "beneath", "lower", "above", or "upper" may be used herein to describe one element's relationship to another element as illustrated in the figures. It will be understood that spatially-relative terms are intended to encompass different orientations of the device in addition to the orientation depicted in the figures. For example, if the device in one of the figures is turned over, elements described as "below" or "beneath" other elements would then be oriented "above" the other elements. The exemplary terms "below" or "beneath" can, therefore, encompass both an orientation of above and below. Since the device may be oriented in another direction, the spatially-relative terms may be interpreted in accordance with the orientation of the device.

The terminology used in the present disclosure is for the purpose of describing particular embodiments only and is not intended to limit the disclosure. As used in the disclosure and the appended claims, the singular forms "a", "an" and "the" are intended to include the plural forms as well, unless context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, the thickness or size of each layer is exaggerated, omitted, or schematically illustrated for convenience of description and clarity. Also, the size or area of each constituent element does not entirely reflect the actual size thereof.

Angles or directions used to describe the structures of light emitting devices according to embodiments are based on those shown in the drawings. Unless there is, in the specification, no definition of a reference point to describe angular positional relations in the structures of the light emitting devices, the associated drawings may be referred to.

FIG. 1 is a sectional view showing a light emitting device package according to an embodiment.

Referring to FIG. 1, a light emitting device package 100 may include a package body 110 having a cavity, a light emitting device 130 mounted in the cavity, a lead frame 120, and a resin 140 filled in the cavity.

The package body 110 may function as a housing. The cavity may be formed in the center of the package body 110 so that the light emitting device 130 is mounted in the cavity.

Also, the package body 110 may wrap the lead frame 120 to support the lead frame 120. The package body 110 may be formed of at least one selected from among a resin material such as polyphthalamide (PPA), silicon (Si), aluminum (Al), aluminum nitride (AlN), liquid crystal polymer, photo sensitive glass (PSG), polyamide 9T (PA9T), syndiotactic polystyrene (SPS), a metallic material, a sapphire (Al2O3), beryllium oxide (BeO), and a printed circuit board (PCB). The package body 110 may be formed by injection molding or etching. However, the disclosure is not limited thereto.

The cavity may be formed in the package body 110 in a state in which the upper side of the cavity is open so that the light emitting device 130 is exposed outward through the cavity. The cavity may be tilted in the package body 110. A reflection angle of light emitted from the light emitting device 130 may vary based on a tilt angle, thereby adjusting a view angle of light emitted outward.

If a view angle of light decreases, concentration of light emitted from the light emitting device 130 increases. On the other hand, if a view angle of light increases, concentration of light emitted from the light emitting device 130 decreases.

Meanwhile, the cavity formed in the package body 110 may be formed in a circular shape, a quadrangular shape, a polygonal shape or an oval shape when viewed from above. In particular, the edge of the cavity may be curved. However, the disclosure is not limited thereto.

A reflective coating layer (not shown) may be formed at an inner side surface, constituting an inner wall of the cavity, and bottom surface of the cavity. The surface of the package 110, at which the reflective coating layer (not shown) is formed, may have predetermined roughness. The surface of the package 110 may be formed of silver (Ag) or aluminum (Al).

The lead frame 120 may be formed of at least one selected from among titanium (Ti), copper (Cu), nickel (Ni), gold (Au), chrome (Cr), tantalum (Ta), platinum (Pt), tin (Sn), silver (Ag), phosphorus (P), aluminum (Al), indium (In), palladium (Pd), cobalt (Co), silicon (Si), germanium (Ge), hafnium (Hf), ruthenium (Ru), and iron (Fe) or an alloy thereof. Also, the lead frame 120 may have a single layer structure or a multi layer structure. However, the disclosure is not limited thereto.

The lead frame 120 may include a first lead frame 121 and a second lead frame 122, via which different powers may be applied. The first lead frame 121 and the second lead frame 122 may be spaced from each other by a predetermined distance. The first lead frame 121 and the second lead frame 122 may be partially wrapped by the package body 110.

The light emitting device 130 is mounted at the upper surface of the first lead frame 121 or the second lead frame 122. The light emitting device 130 may be a kind of semiconductor device emitting light having a predetermined wavelength when external power is applied to the light emitting device 130. The light emitting device 130 may be formed of a III or V group compound, such as gallium nitride (GaN), aluminum nitride (AlN), indium nitride (InN), or gallium arsenic (GaAs). For example, the light emitting device 130 may be a light emitting diode.

The light emitting diode may be a colored light emitting diode to emit red, green, blue or white light or an ultraviolet (UV) light emitting diode to emit UV light. However, the disclosure is not limited thereto. In this embodiment, a single light emitting diode is provided at the center of the light emitting device package. However, the disclosure is not limited thereto. The light emitting device package may include a plurality of light emitting diodes.

Also, the light emitting device may be a horizontal type light emitting device in which electrical terminals are formed at the upper surface of the light emitting device or a vertical type light emitting device in which electrical terminals are formed at the upper and lower surfaces of the light emitting device.

The horizontal type light emitting device is electrically connected to the first lead frame 121 and the second lead frame 122 by wire bonding using two wires so that external power is applied to the light emitting device. On the other hand, the vertical type light emitting device is electrically connected to the first lead frame 121 and the second lead frame 122 by wire bonding using one wire so that external power is applied to the light emitting device.

The resin 140 may be filled in the cavity so as to seal the light emitting device 130 and the wire. The resin 140 may be formed of a light transmitting resin material, such as silicone or epoxy. The light transmitting resin material may be filled in the cavity and may be UV or thermally cured to form the resin 140.

The surface of the resin 140 may be formed in a concave lens shape, a convex lens shape or a flat shape. A view angle of light emitted from the light emitting device 130 may vary based on the shape of the resin 140.

Also, another resin formed in another lens shape may be formed on or fixed to the top of the resin 140. However, the disclosure is not limited thereto.

The resin 140 may contain a fluorescent substance. The kind of the fluorescent substance may be selected based on the wavelength of light emitted from the light emitting device 130 so that the light emitting device package 100 emits white light.

That is, the fluorescent substance may be excited by first light emitted from the light emitting device 130 to generate second light. For example, if the light emitting device 130 is a blue light emitting diode and the fluorescent substance is a yellow fluorescent substance, the yellow fluorescent substance may be excited by the blue light to emit yellow light, and the blue light generated from the blue light emitting diode and the yellow light excited by the blue light may be mixed. As a result, the light emitting device package 100 emits white light.

In a similar manner, if the light emitting device 130 is a green light emitting diode, a magenta fluorescent substance or blue and red fluorescent substances may be mixed. Also, if the light emitting device 130 is a red light emitting diode, a cyan fluorescent substance or blue and green fluorescent substances may be mixed.

The fluorescent substances may be well-known fluorescent substances, such as a YAG fluorescent substance, a TAG fluorescent substance, a sulfide fluorescent substance, a silicate fluorescent substance, an aluminate fluorescent substance, a nitride fluorescent substance, a carbide fluorescent substance, a nitridosilicate fluorescent substance, a borate fluorescent substance, a fluoride fluorescent substance, and a phosphate fluorescent substance.

Hereinafter, a wire bonding structure encircled by a portion A of FIG. 1 will be described in detail.

Figure 2:
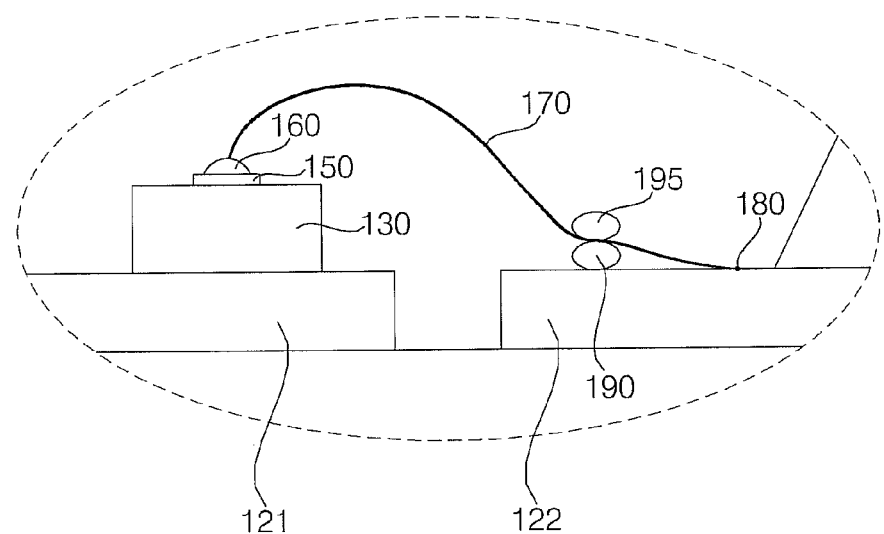
FIG. 2 is a view showing a wire bonding structure of the light emitting device package according to the embodiment.

FIG. 2 is a view showing a wire bonding structure of the light emitting device package according to the embodiment.

Referring to FIG. 2, primary bonding to bond a wire to the light emitting device 130 and secondary bonding to bond the wire connected as the result of the primary bonding to the second lead frame 122 are needed so as to electrically connect the light emitting device 130 positioned on the first frame 121 to the second lead frame 122. The wire bonding structure may include the light emitting device 130, an electrode pad 150, a pad ball 160, a first wire 170, a first bonding ball 190, a second bonding ball 195, the first lead frame 121, and the second lead frame 122.

The light emitting device 130 may be positioned on the first lead frame 121. The first lead frame 121 and the light emitting device 130 were described previously with reference to FIG. 1, and therefore, a further description thereof will not be given.

The electrode pad 150 may be formed at the upper surface of the light emitting device 130.

The electrode pad 150 may be formed of a conductive material. For example, the electrode pad 150 may be formed of any one selected from among indium (In), cobalt (Co), silicon (Si), germanium (Ge), gold (Au), palladium (Pd), platinum (Pt), ruthenium (Ru), rhenium (Re), magnesium (Mg), zinc (Zn), hafnium (Hf), tantalum (Ta), rhodium (Rh), iridium (Ir), tungsten (W), titanium (Ti), silver (Ag), chrome (Cr), molybdenum (Mo), niobium (Nb), aluminum (Al), nickel (Ni), and copper (Cu) or an alloy of two or more thereof. Two or more different materials may be stacked to form the electrode pad 150.

The pad ball 160 may be formed on the electrode pad 150. The wire is electrically discharged using a capillary with the result that the pad ball 160 is formed at one end of the wire. Ultrasonic waves and pressure are applied to the pad ball 160 and the electrode pad 150 in a state in which the pad ball 160 is in contact with the surface of the electrode pad 150. As a result, metal bonding between the electrode pad 150 and the pad ball 160 is achieved. Bonding intensity may vary depending upon intensity of ultrasonic waves, load applied to the pad ball, application time of ultrasonic waves, etc.

For example, if the intensity of ultrasonic waves or load applied to the pad ball 160 is high, bonding intensity increases. In this case, however, the electrode pad 150 may be damaged with the result that reliability may be deteriorated.

After the pad ball 160 is formed, the capillary may move to above the second lead frame 122 so as to form a loop using the first wire 170.

The first wire 170 may be a gold wire, a silver wire, an aluminum wire, or a copper wire. The loop formed using the wire may be classified as a high loop, a middle loop, or a low loop based on height of the loop. The high loop wire may be used to perform bonding so that the edge of the light emitting device or the light emitting device package does not contact the wire since the height of the loop is high but the length of the loop is short. On the other hand, the low loop wire may be used in a thin light emitting device package since a crystalline region is shorted so that the height of the loop is low.

The diameter of the first wire 170 decides the magnitude of current that can flow along the first wire 170. Consequently, required current and voltage may be calculated to decide the size of the first wire 170.

In this embodiment, the first wire 170 may have a diameter of 0.7 mil to 2 mil.

After the first wire 170 is stitch bonded to the second lead frame 122, the first wire 170 may be pressed by the capillary so that the first wire 170 is cut and fixed to the top of the second lead frame 122.

An adhesive (not shown) may be applied to a first contact point 180 between the first wire 170 and the second lead frame 122.

The adhesive (not shown) may be a conductive adhesive. The adhesive may be formed of a thermally curable epoxy resin and metal powder such as silver (Ag) or copper (Cu). The adhesive may be adhered in the form of a ball. Upon application of the adhesive, the adhesion force at the first contact point 180 increases. Although the first wire 170 and the second lead frame 122 are separated from each other at the first contact point 180, current continues to flow between first wire 170 and the second lead frame 122 since the adhesive exhibits conductivity.

The first bonding ball 190 may be positioned on the second lead frame 122 in a state in which the first bonding ball 190 is spaced apart from the first contact point 180.

If the first bonding ball 190 is formed of a conductive material and is spaced apart from the first contact point 180, the first wire 170 is electrically connected to the second lead frame 122 at a contact point between the first bonding ball 190 and the second lead frame 122 as well as at the first contact point 180.

Even when the first wire 170 and the second lead frame 122 are separated from each other at the first contact point 180, therefore, electrical connection between the first wire 170 and the second lead frame 122 is maintained by the first bonding ball 190, thereby improving reliability of wire bonding.

The distance between the center of the first bonding ball 190 and the first contact point 180 may be 20 um to 50 um. If the distance between the center of the first bonding ball 190 and the first contact point 180 is less than 20 um, the first wire 170 may be separated from the first contact point 180 due to the height of the first bonding ball 190. On the other hand, if the distance between the center of the first bonding ball 190 and the first contact point 180 is greater than 50 um, the first wire 170 is bent at the first bonding ball 190 with the result that adhesion force between the first wire 170 and the first bonding ball 190 is lowered.

The second bonding ball 195 may be positioned above the first bonding ball 190 so that the first wire 170 is disposed between the second bonding ball 195 and the first bonding ball 190 to fix the first wire 170.

When the first wire 170 is fixed using the first bonding ball 190 and the second bonding ball 195 as described above, separation of the first wire 170 from the first bonding ball 190 is prevented, and external impact applied to the wire bonded portion at the first contact point 180 is relieved, thereby improving reliability of wire bonding.

Also, the first wire 170 is pushed by the second bonding ball 195 with the result that the first wire 170 is softly connected to the first contact point 180, thereby preventing separation of the first wire 170 from the second lead frame 122 at the first contact point 180.

The first bonding ball 190 and the second bonding ball 195 may be formed of a conductive material, such as Ag, Cu, Al or Au.

The size of the second bonding ball 195 may be greater than that of the first bonding ball 190.

The first bonding ball 190 may have a width of 95 um to 105 um, and the second bonding ball 195 may have a width of 76 um to 84 um.

Figure 3A:
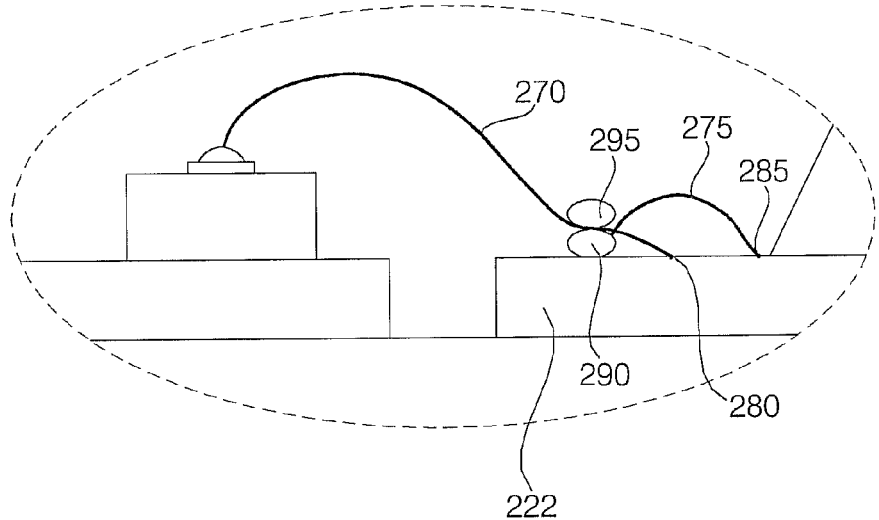
FIGS. 3A and 3B are views showing wire bonding structures of a light emitting device package according to other embodiments.
Figure 3B:
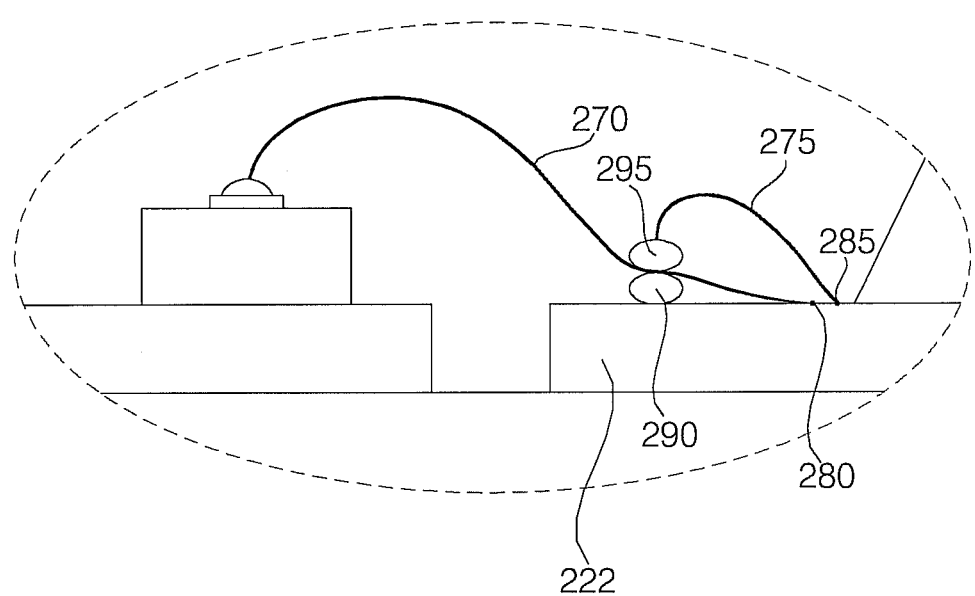

FIGS. 3A and 3B are views showing wire bonding structures of a light emitting device package according to other embodiments.

Referring to FIGS. 3A and 3B, a second wire 275 may be provided at a first bonding ball 290 or a second bonding ball 295 so that the first bonding ball 290 or the second bonding ball 295 is electrically connected to a second lead frame 222 via the second wire 275.

The second wire 275 may be electrically connected to a first wire 270 by a first bonding ball 290 or a second bonding ball 295.

The second wire 275 may be formed of the same material for the first wire 270 and may be formed using the same method as in the first wire 270. Alternatively, the second wire 275 may be shorter than the first wire 270. If the second wire 275 is longer, external impact applied to the second wire 275 may become stronger.

A second contact point 285 between the second wire 275 and the second lead frame 222 may be spaced apart from a first contact point 280.

If the second contact point 285 is spaced apart from the first contact point 280, the first wire 270 may be electrically connected to the second lead frame 222 at the second contact point 285 as well as the first contact point 280.

Even when the first wire 270 is separated from the second lead frame 222 at the first contact point 280, therefore, electrical connection between the first wire 270 and the second lead frame 222 is maintained by the second wire 275 and the first bonding ball 290 or by the second wire 275 and the second bonding ball 295, thereby improving reliability of wire bonding.

Figure 4A:
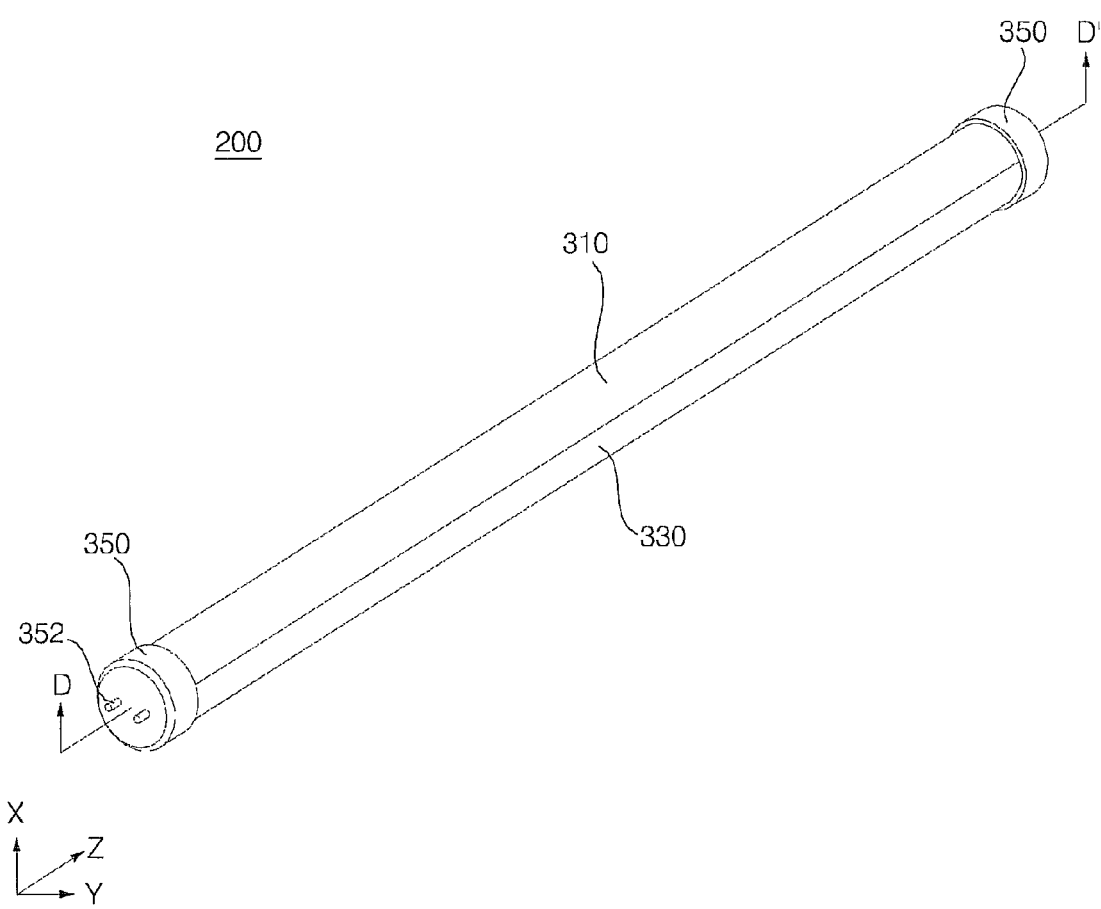
FIG. 4A is a perspective view showing a lighting apparatus including a light emitting device package according to an embodiment.
Figure 4B:
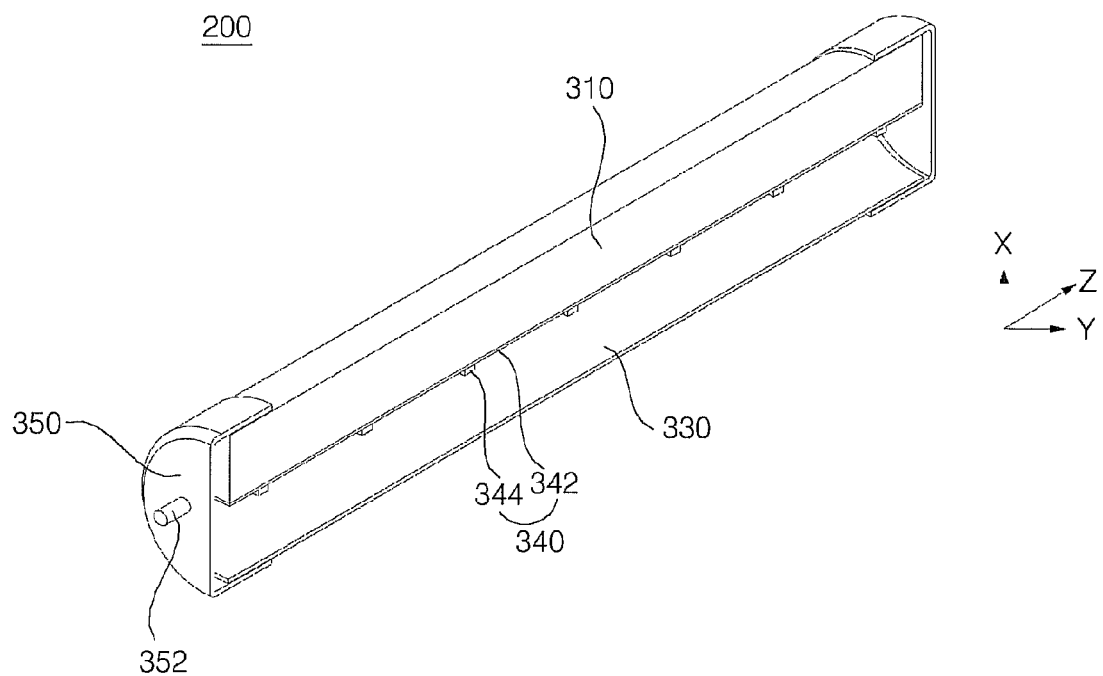
FIG. 4B is a sectional view taken along line D-D' of FIG. 4A.

FIG. 4A is a perspective view showing a lighting apparatus including a light emitting device package according to an embodiment, and FIG. 4B is a sectional view taken along line D-D' of FIG. 4A.

Hereinafter, a lighting apparatus 200 will be described based on a longitudinal direction Z of the lighting apparatus 200, a horizontal direction Y perpendicular to the longitudinal direction Z, and a height direction X perpendicular to the longitudinal direction Z and the horizontal direction Y so as to describe the shape of the lighting apparatus 200 in more detail.

That is, FIG. 4B is a sectional view of the lighting apparatus 200 shown in FIG. 4A when the lighting apparatus 200 is cut in the longitudinal direction Z and the height direction X and is viewed in the horizontal direction Y.

Referring to FIGS. 4A and 4B, the lighting apparatus 200 may include an apparatus body 310, a cover 330 fastened to the apparatus body 310, and closing caps 350 provided at opposite ends of the apparatus body 310.

A light emitting device module 340 is fastened to the lower surface of the apparatus body 310. The apparatus body 310 may be formed of a metallic material exhibiting high conductivity and heat dissipation to discharge heat generated from light emitting device packages 344 outward through the upper surface of the apparatus body 310.

Several color light emitting device packages 344 may be mounted on a PCB 342 at several rows to constitute an array. The light emitting device packages 344 may be mounted on the PCB 342 at the same interval or at various intervals as needed so as to adjust brightness of the lighting apparatus 200. A metal core PCB or a PCB formed of an FR4 material may be used as the PCB 342.

Meanwhile, each of the light emitting device packages 344 may include a film, having a plurality of holes, formed of a conductive material.

The film, formed of the conductive material such as metal, may cause substantial light interference. As a result, intensity of light waves may be increased by interaction of the light waves, and therefore, light is effectively extracted and diffused. Light generated from the light source is interfered and diffracted through the holes formed in the film, and therefore, light is effectively extracted. Consequently, efficiency of the lighting apparatus 200 is improved. The size of each of the holes formed in the film may be less than the wavelength of light generated from the light source.

The cover 330 protects the light emitting device module 340 from external foreign matter. Also, the cover 330 may contain diffusion particles to prevent glare and to uniformly discharge light outward. In addition, a prism pattern may be formed at the inner surface and/or the outer surface of the cover 330. Also, a florescent substance may be applied to the inner surface and/or the outer surface of the cover 330.

Meanwhile, light generated from the light emitting device packages 344 is discharged outward through the cover 330. For this reason, it is necessary for the cover 330 to exhibit high light transmissivity and heat resistance sufficient to endure heat generated from the light emitting device packages 344. The cover 330 may be formed of a material including polyethylene terephthalate (PET), polycarbonate (PC) or polymethyl methacrylate (PMMA).

The closing caps 350 are provided at the opposite ends of the apparatus body 310 to cover a power supply unit (not shown). Also, power pins 352 are formed at each of the closing caps 350. Consequently, the lighting apparatus 200 according to this embodiment may be directly connected to a terminal, from which the existing fluorescent lamp is removed, without using an additional connection member.

Figure 5:
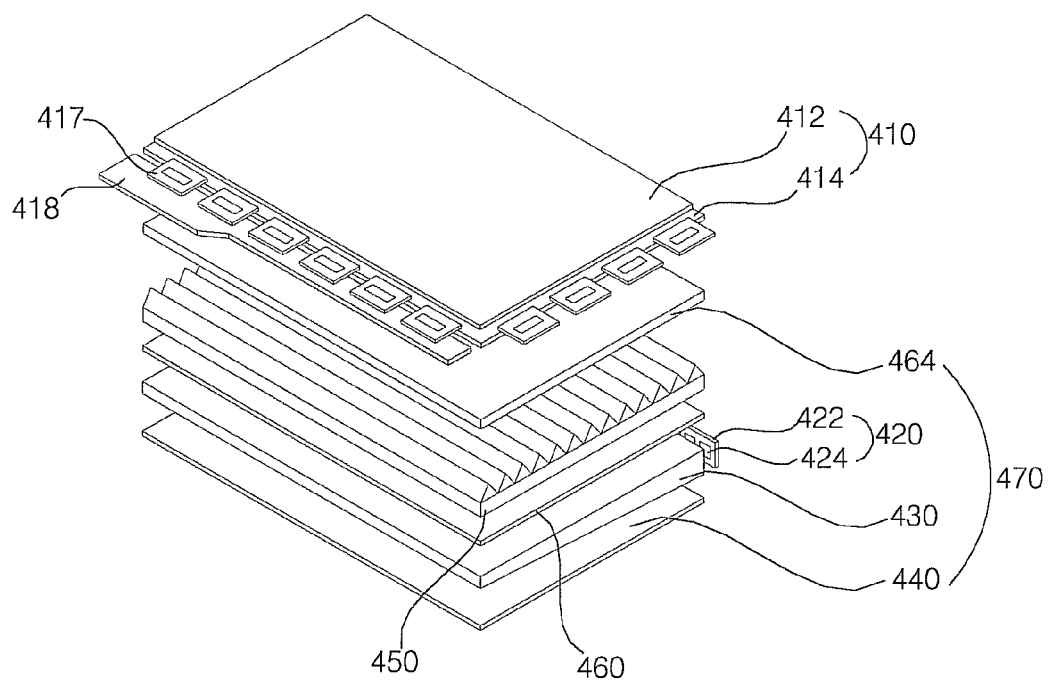
FIG. 5 is an exploded perspective view showing a backlight unit including a light emitting device package according to an embodiment.

FIG. 5 is an exploded perspective view showing a backlight unit including a light emitting device package according to an embodiment.

An edge light type backlight unit is shown in FIG. 5. A liquid crystal display apparatus 300 may include a liquid crystal display panel 410 and a backlight unit 470 to supply light to the liquid crystal display panel 410.

The liquid crystal display panel 410 may display an image using light emitted from the backlight unit 470. The liquid crystal display panel 410 may include a color filter substrate 412 and a thin film transistor substrate 414 opposite to each other in a state in which a liquid crystal is disposed between the color filter substrate 412 and the thin film transistor substrate 414.

The color filter substrate 412 may realize colors of the image displayed through the liquid crystal display panel 410.

The thin film transistor substrate 414 is electrically connected to a printed circuit board 418, on which a plurality of circuit parts is mounted, via drive films 417. The thin film transistor substrate 414 may apply drive voltage supplied from the printed circuit board 418 to the liquid crystal in response to a drive signal provided by the printed circuit board 418.

The thin film transistor substrate 414 may include a thin film transistor and a pixel electrode formed on another transparent substrate, such as glass or plastic.

The backlight unit 470 includes a light emitting device module 420 to emit light, a light guide plate 430 to change the light emitted from the light emitting device module 420 into surface emission light and to provide the surface emission light to the liquid crystal display panel 410, a plurality of films 450, 460 and 464 to uniformalize brightness distribution of the light provided from the light guide plate 430, thereby improving vertical incidence of light, and a reflective sheet 440 to reflect light emitted to the rear of the light guide plate 430 to the light guide plate 430.

The light emitting device module 420 may include a plurality of light emitting device packages 424 and a PCB 422 on which the light emitting device packages 424 are mounted to constitute an array.

In particular, each of the light emitting device packages 424 includes a film, having a plurality of holes, formed at a light emission surface thereof. As a result, a lens may be omitted, thereby realizing a slim type light emitting device package and, at the same time, improving light extraction efficiency. Consequently, it is possible to realize a very thin backlight unit 470.

Meanwhile, the backlight unit 470 may further include a diffusion film 460 to diffuse the light emitted from the light guide plate 430 toward the liquid crystal display panel 410 and a prism film 450 to condense the diffused light, thereby improving vertical incidence of light. Also, the backlight unit 470 may further include a protection film 464 to protect the prism film 450.

Figure 6:
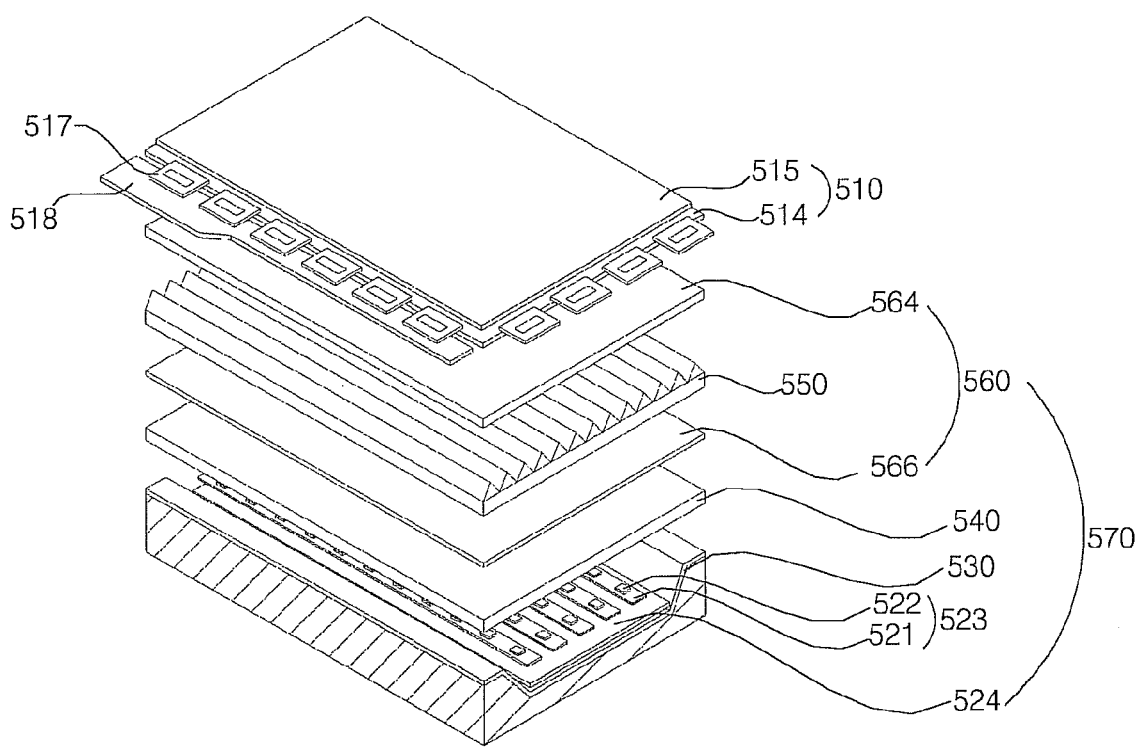
FIG. 6 is an exploded perspective view showing a backlight unit including a light emitting device package according to another embodiment.

FIG. 6 is an exploded perspective view showing a backlight unit including a light emitting device package according to another embodiment.

However, parts shown in FIG. 5 and described with reference to FIG. 5 will not be described in detail.

A direct type backlight unit is shown in FIG. 6. A liquid crystal display apparatus 400 may include a liquid crystal display panel 510 and a backlight unit 570 to supply light to the liquid crystal display panel 510.

The liquid crystal display panel 510 is identical to the liquid crystal display panel 410 of FIG. 5, and therefore, a detailed description thereof will not be given.

The backlight unit 570 may include a plurality of light emitting device modules 523, a reflective sheet 524, a lower chassis 530 in which the light emitting device modules 523 and the reflective sheet 524 are disposed, a diffusion plate 540 disposed above the light emitting device modules 523, and a plurality of optical films 560.

Each of the light emitting device modules 523 may include a PCB 531 on which on which a plurality of light emitting device packages 522 is mounted to constitute an array.

In particular, each of the light emitting device packages 522 includes a conductive film, having a plurality holes, provided at a light emission surface thereof. As a result, a lens may be omitted, thereby realizing a slim type light emitting device package and, at the same time, improving light extraction efficiency. Consequently, it is possible to realize a very thin backlight unit 570.

The reflective sheet 524 reflects light emitted from the light emitting device packages 522 toward the liquid crystal display panel 510, thereby improving luminous efficacy.

Meanwhile, light emitted from the light emitting device modules 523 is incident upon the diffusion plate 540. The optical films 560 are disposed above the diffusion plate 540. The optical films 560 include a diffusion film 566, a prism film 550, and a protection film 564.

As is apparent from the above description, in the light emitting device package and the lighting system including the backlight unit and the lighting apparatus, the wire is fixed using the bonding ball upon wire bonding, thereby preventing the wire from separating from the lead frame at the bonded portion therebetween. Also, the wire is electrically connected to the lead frame via the bonding ball, thereby improving reliability of wire bonding.

Although embodiments have been described with reference to a number of illustrative embodiments thereof, it should be understood that numerous other modifications and applications may be devised by those skilled in the art that will fall within the intrinsic aspects of the embodiments. More particularly, various variations and modifications are possible in concrete constituent elements of the embodiments. In addition, it is to be understood that differences relevant to the variations and modifications fall within the spirit and scope of the present disclosure defined in the appended claims.

What is claimed is:

1. A light emitting device package comprising:
   a light emitting device disposed on a first lead frame, the light emitting device having an electrode pad on an upper surface thereof;
   a first wire to electrically interconnect a second lead frame spaced apart from the first lead frame and the electrode pad; and
   a first bonding ball disposed on the second lead frame, the first bonding ball spaced apart from a first contact point, which is in contact with the first wire and the second lead frame, wherein
   the first bonding ball is disposed between the first wire and the second lead frame to electrically interconnect the first wire and the second lead frame.

2. The light emitting device package according to claim 1, wherein
   the light emitting device comprises a pad ball on the electrode pad, and
   the first wire electrically interconnects the pad ball and the second lead frame.

3. The light emitting device package according to claim 1, further comprising a second wire to electrically interconnect the first bonding ball and the second lead frame.

4. The light emitting device package according to claim 3, wherein the first wire or the second wire include at least one selected from among gold, silver, aluminum, and copper.

5. The light emitting device package according to claim 3, wherein a second contact point, which is contact with the second wire and the second lead frame, is spaced apart from the first contact point.

6. The light emitting device package according to claim 1, wherein an adhesive is applied to the first contact point.

7. The light emitting device package according to claim 1, wherein a distance between a center of the first bonding ball and the first contact point is 20 um to 50 um.

8. The light emitting device package according to claim 1, wherein the first bonding ball includes Ag.

9. The light emitting device package according to claim 1, further comprising:
   a package body having a cavity in which the light emitting device is mounted; and
   a resin filled in the cavity.

10. The light emitting device package according to claim 9, wherein the resin contains a fluorescent substance and/or a light diffuser.

11. A light emitting device package comprising:
    a light emitting device disposed on a first lead frame, the light emitting device having an electrode pad on an upper surface thereof;
    a first wire to electrically interconnect a second lead frame spaced apart from the first lead frame and the electrode pad;
    a first bonding ball disposed on the second lead frame, the first bonding ball spaced apart from a first contact point, which is in contact with the first wire and the second lead frame; and
    a second bonding ball disposed on the first bonding ball, wherein
    the first bonding ball is disposed between the first wire and the second lead frame to electrically interconnect the first wire and the second lead frame, and
    the first wire is disposed between the first bonding ball and the second bonding ball so that the first wire is fixed by the first bonding ball and the second bonding ball.

12. The light emitting device package according to claim 11, further comprising a second wire to electrically interconnect the first bonding ball or the second bonding ball and the second lead frame.

13. The light emitting device package according to claim 12, wherein the first wire or the second wire include at least one selected from among gold, silver, aluminum, and copper.

14. The light emitting device package according to claim 12, wherein a second contact point, which is contact with the second wire and the second lead frame, is spaced apart from the first contact point.

15. The light emitting device package according to claim 11, wherein an adhesive is applied to the first contact point.

16. The light emitting device package according to claim 11, wherein a distance between a center of the first bonding ball and the first contact point is 20 um to 50 um.

17. The light emitting device package according to claim 11, wherein the first bonding ball or the second bonding ball include Ag.

18. The light emitting device package according to claim 11, wherein the first bonding ball has a width greater than that of the second bonding ball.

19. A lighting system comprising:
a board; and
a light emitting device package mounted on the board, wherein the light emitting device package comprises:
a light emitting device disposed on a first lead frame, the light emitting device having an electrode pad on an upper surface thereof;
a first wire to electrically interconnect a second lead frame spaced apart from the first lead frame and the electrode pad; and
a first bonding ball disposed on the second lead frame, the first bonding ball spaced apart from a first contact point, which is contact with the first wire and the second lead frame,
wherein the first bonding ball is disposed between the first wire and the second lead frame to electrically interconnect the first wire and the second lead frame.

20. The lighting system according to claim 19, wherein the light emitting device package further comprises a second bonding ball disposed on the first bonding ball, and the first wire is disposed between the first bonding ball and the second bonding ball so that the first wire is fixed by the first bonding ball and the second bonding ball.

* * * * *